United States Patent
Li et al.

(10) Patent No.: US 6,261,941 B1
(45) Date of Patent: Jul. 17, 2001

(54) METHOD FOR MANUFACTURING A MULTILAYER WIRING SUBSTRATE

(75) Inventors: Weipang Li, Atlanta; Rao R. Tummala, Stone Mountain, both of GA (US)

(73) Assignee: Georgia Tech Research Corp., Atlanta, GA (US)

(*) Notice: Subject to any disclaimer, the term of this patent is extended or adjusted under 35 U.S.C. 154(b) by 0 days.

(21) Appl. No.: 09/249,449

(22) Filed: Feb. 12, 1999

Related U.S. Application Data

(60) Provisional application No. 60/074,558, filed on Feb. 12, 1998, and provisional application No. 60/078,453, filed on Mar. 18, 1998.

(51) Int. Cl.[7] .............................................. H01L 21/4763
(52) U.S. Cl. ........................ 438/618; 438/631; 438/645
(58) Field of Search .................................. 438/618, 626, 438/631, 645, 669; 257/752, 753, 764, 774, 776

(56) References Cited

U.S. PATENT DOCUMENTS

| | | | |
|---|---|---|---|
| 4,279,797 | * | 7/1981 | Nelson et al. ............... 260/33.4 R |
| 4,306,925 | | 12/1981 | Lebow et al. ..................... 156/150 |
| 4,698,294 | * | 10/1987 | Lau et al. ......................... 430/325 |
| 4,790,902 | * | 12/1988 | Wada et al. ...................... 156/630 |
| 4,810,332 | | 3/1989 | Pan .................................... 204/15 |
| 4,894,115 | * | 1/1990 | Eichelberger et al. ........... 156/643 |
| 4,996,584 | * | 2/1991 | Young et al. ....................... 357/71 |
| 5,055,425 | | 10/1991 | Leibovitz et al. ................ 437/195 |
| 5,104,480 | * | 4/1992 | Wojnarowski et al. ........... 156/643 |
| 5,354,712 | * | 10/1994 | Ho et al. ........................... 438/643 |
| 5,512,514 | * | 4/1996 | Lee .................................. 438/626 |
| 5,523,174 | * | 6/1996 | Tamaki ............................. 428/669 |
| 5,619,315 | * | 4/1997 | Kusumoto et al. ............... 399/324 |
| 5,659,201 | * | 8/1997 | Wollesen .......................... 257/758 |
| 5,726,100 | | 3/1998 | Givens ............................. 438/702 |
| 5,758,413 | | 6/1998 | Chong et al. ...................... 29/852 |
| 5,822,856 | | 10/1998 | Bhatt et al. ........................ 29/832 |
| 5,825,076 | | 10/1998 | Kotvas et al. .................... 257/622 |
| 5,847,457 | | 12/1998 | Chen et al. ....................... 257/750 |
| 5,893,752 | * | 4/1999 | Zhang et al. ..................... 438/687 |
| 5,968,333 | * | 10/1999 | Nogami et al. ................... 205/184 |
| 6,020,640 | * | 2/2000 | Efland et al. ..................... 257/751 |
| 6,054,061 | * | 4/2000 | Bayes et al. ....................... 216/13 |

FOREIGN PATENT DOCUMENTS

01165434 * 6/1989 (JP) .............................. B32B/9/00

* cited by examiner

Primary Examiner—Olik Chaudhuri
Assistant Examiner—Nathan W. Ha
(74) Attorney, Agent, or Firm—Thomas, Kayden, Horstemeyer & Risley, L.L.P.

(57) ABSTRACT

Generally, the present invention can be viewed as providing a method for manufacturing a multilayer wiring substrate. Briefly described, the method can be broadly conceptualized by the following steps: forming a first conductive connection on a first insulating layer; forming a conductive post on the first conductive connection; forming a second insulating layer on the first conductive connection, the first insulating layer, and the conductive post; exposing the conductive post by removing a portion of the second insulating layer; and forming a second conductive connection on the second insulating layer such that the second conductive connection is electrically connected to the first conductive connection via the conductive post. The second insulating layer can be formed via dry film lamination. In addition, the conductive posts can be exposed by either forming holes in the second insulating layer or by roughening the surface of the second insulating layer.

22 Claims, 7 Drawing Sheets

METHOD FOR MANUFACTURING A MULTILAYER WIRING SUBSTRATE

CROSS REFERENCE TO RELATED APPLICATIONS

This document claims priority to and the benefit of the filing date of co-pending provisional application entitled "PLATED-POST, PHOTO-POLYMER TECHNIQUE TO CONSTRUCT PLANAR MULTILAYER WIRING SUBSTRATE WITH FILLED AND STACKED VIAS," assigned Ser. No. 60/074,558 and filed on Feb. 12, 1998, and co-pending provisional application entitled "PLANAR MULTILAYER SUBSTRATE FABRICATION WITH FILLED AND STACKED VIAS BY POST PLATING," assigned Ser. No. 60/078,453 and filed on Mar. 18, 1998, which are both incorporated herein by reference.

BACKGROUND OF THE INVENTION

1. Field of the Invention

The present invention generally relates to microfabrication techniques and, in particular, to a method for forming multiple layers of a wiring substrate and for interconnecting electrical connections on the multiple layers.

2. Related Art

Wiring substrates are typically used to electrically connect various components or devices of an electronic system. For example, a computer or other electrical system often utilizes various components including, but not limited to, many different types of passive elements and integrated circuits. These components are usually coupled to a wiring substrate that provides electrical connections between the components. For example, one type of wiring substrate used by many electrical systems is a printed wiring board, sometimes referred to as a "printed circuit board." Printed wiring boards typically use an epoxy-glass laminate as a dielectric layer and include copper traces that electrically connect the components that are coupled to the printed wiring board. Most copper traces are narrow lines of copper that extend from an electrical contact of one component to an electrical contact of another component. The copper traces do not necessarily follow a straight line path from one component to another component but instead usually bend or curve to prevent the copper traces from shorting with each other.

Other major types of wiring substrates include ceramic and thin film substrates that enable a higher wiring density (i.e., length of wire per unit area) than conventional printed circuit boards. However, the cost of manufacturing the ceramic and thin film substrates is much greater than the cost of printed wiring boards. Therefore, the use of ceramic and/or thin film substrates has been limited.

To increase the capacity of wiring substrates (i.e., printed circuit boards, ceramic substrates, or thin film substrates), the number of layers of the wiring substrate is usually increased. Therefore, many conventional wiring substrates are multilayer structures. Furthermore, to provide vertical interlayer connectivity in multilayer wiring substrates, vias (in multilayer ceramic and multilayer thin film) and plated through holes (in multilayer printed wiring board) are formed.

A via is a vertical connection that electrically connects a conductive connection of one layer to a conductive connection of another layer. Unfortunately, existing techniques for via formation (i.e., filling and stacking) involve expensive and complex planarization processes, thereby increasing the cost and decreasing the yield of manufacturing wiring substrates. In fact, the high costs associated with conventional via filling and stacking prevent their use in many applications.

On the other hand, typical plated through holes are inexpensive and simple to fabricate but are relatively large compared to vias and pass through all of the layers of the wiring substrate. Therefore, a significant amount of space within the wiring substrate is taken up by plated through holes, resulting in a low wiring efficiency.

Consequently, conventional techniques for interconnecting layers of a multilayer substrate are expensive or inefficient. Thus, a heretofore unaddressed need exists in the industry for providing an inexpensive and efficient method of manufacturing a multilayer wiring substrate.

SUMMARY OF THE INVENTION

The present invention overcomes the inadequacies and deficiencies of the prior art as discussed herein. The present invention can be viewed as providing a method for manufacturing a multilayer wiring substrate. Briefly described, the method can be broadly conceptualized by the following steps: forming a first conductive connection on a first insulating layer; forming a conductive post on the first conductive connection; forming a second insulating layer on the first conductive connection, the first insulating layer, and the conductive post; exposing the conductive post by removing a portion of the second insulating layer; and forming a second conductive connection on the second insulating layer such that the second conductive connection is electrically coupled to the first conductive connection via the conductive post.

In accordance with another feature of the present invention, the second insulating layer is formed via dry film lamination.

In accordance with another feature of the present invention, the conductive post is exposed via a surface roughening process.

In accordance with another feature of the present invention, a hole is formed in the second insulating layer to expose the conductive post. This hole allows the second conductive connection to be electrically coupled to the conductive post.

In accordance with another feature of the present invention, a press is applied to the surface of the second insulating layer in order to planarize the surface of the second inuslative layer.

The present invention has many advantages, a few of which are delineated hereafter, as mere examples.

An advantage of the present invention is that expensive planarization steps are not required in forming planar multilayer wiring substrates.

Another advantage of the present invention is that wiring substrates can be easily manufactured.

Another advantage of the present invention is that manufacturing costs of wiring substrates can be significantly reduced.

Other features and advantages of the present invention will become apparent to one skilled in the art upon examination of the following detailed description, when read in conjunction with the accompanying drawings. It is intended that all such features and advantages be included herein within the scope of the present invention, as is defined by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE INVENTION

Figure 1:
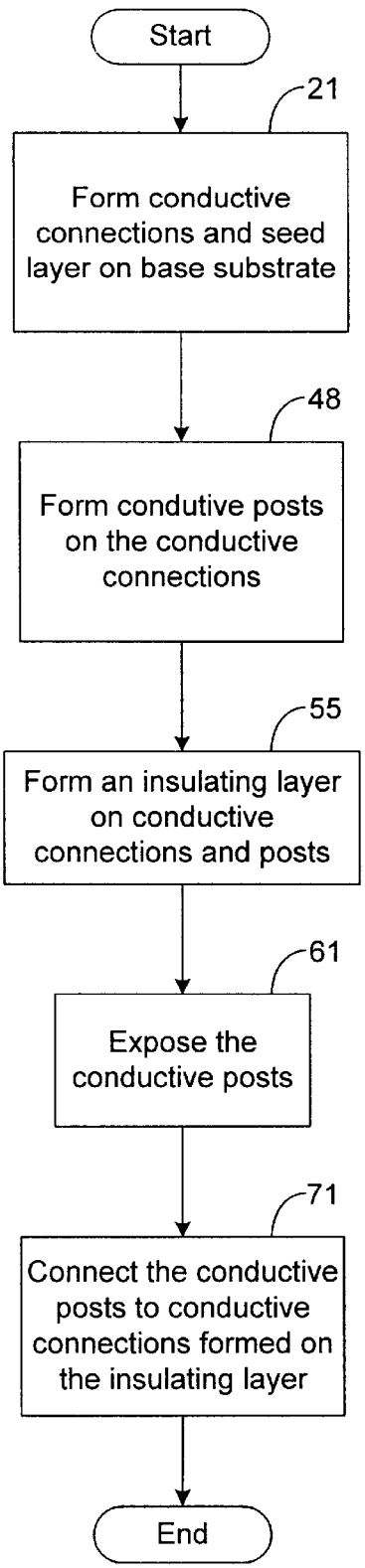
FIG. 1 is a flow chart illustrating the methodology of the present invention.
Figure 2A:
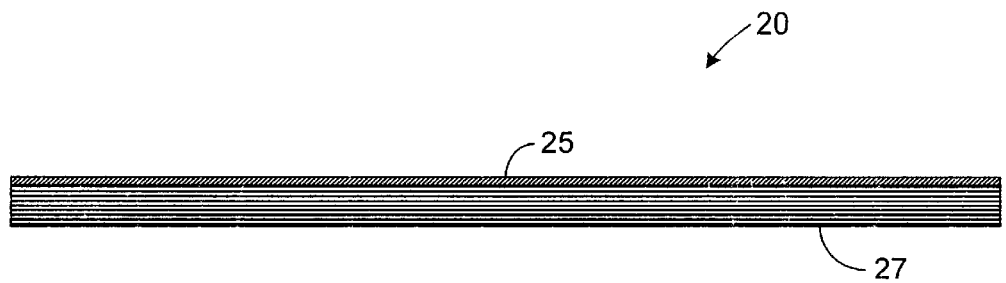
FIG. 2A is a cross sectional view of a microfabricated device of the present invention after a seeding layer has been formed on a base substrate.
Figure 2B:
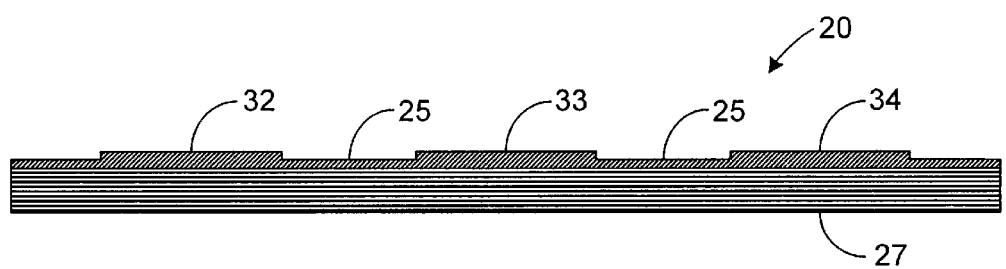
FIG. 2B is a cross sectional view of the microfabricated device of FIG. 2A after conductive connections have been formed.
Figure 2C:
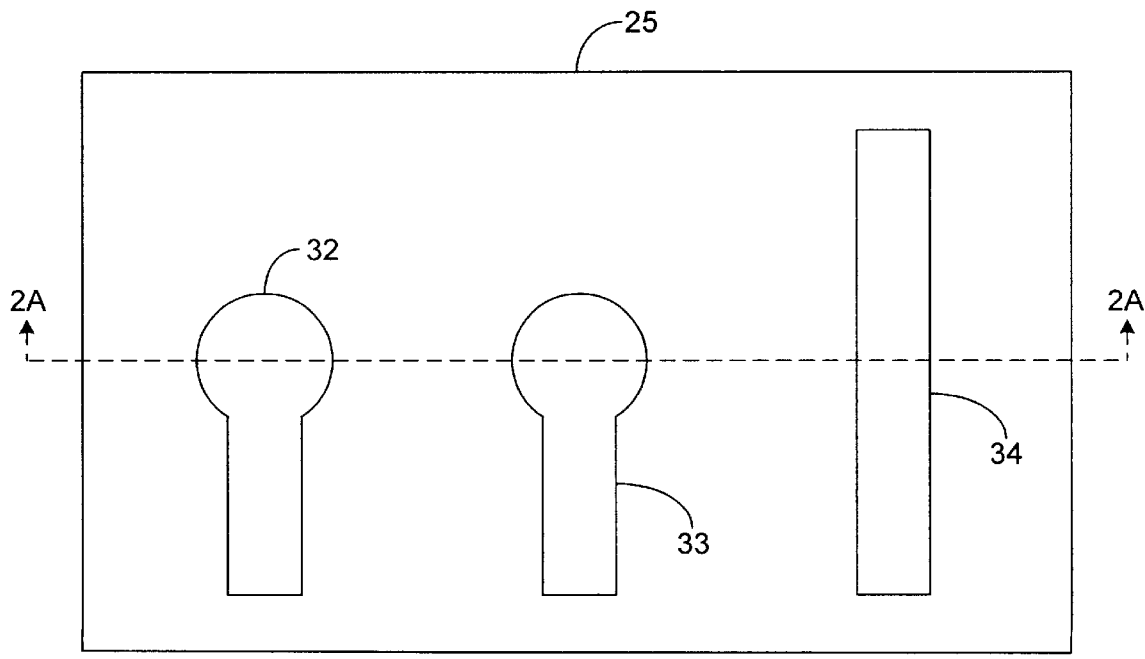
FIG. 2C is a top view of the microfabricated device of FIG. 2B.

In general, the present invention provides an inexpensive and efficient method for manufacturing microfabricated multilayer wiring devices. FIG. 1 depicts a flow chart illustrating the steps performed in manufacturing a wiring device in accordance with the preferred embodiment of the present invention. As illustrated by block 21 and FIG. 2A, a conductive seed layer 25 is formed on a base substrate 27. Preferably, the seed layer 25 is comprised of copper, although other conductive materials are also possible. Next, as shown by FIG. 2B and block 21 of FIG. 1, conductive connections 32–34 are formed on seed layer 25 via any suitable microfabrication technique. As can be seen by referring to FIG. 2C, the connections 32–34 may extend over various portions of the seed layer 25. It should be noted that only three connections 32–34 are shown in FIGS. 2B and 2C for simplicity. However, the number of connections 32–34 and the configuration of connections 32–34 may vary without departing from the principles of the present invention.

The connections 32–34 are preferably comprised of copper, although other conductive materials for the connections 32–34 may be employed. Furthermore, the connections 32–34 can be formed via any suitable microfabrication process known in the art, such as, but not limited to, electroless seeding followed by electro pattern plating. In addition, connections 32–34 may be formed on the substrate 27 prior to formation of the seeding layer 25, which (in this scenario) is then formed on both the substrate 27 and the connections 32–34. In fact, formation of a seeding layer 25 is not necessary for implementation of the present invention and may be omitted entirely from the methodology of the present invention.

The substrate 27 can be comprised of various materials and can include various layers of different materials. However, it is preferable for the outer surface of the substrate 27 (i.e., the surface of the substrate 27 coupled to seed layer 25) to be comprised of an insulative material to prevent the connections 32–34 from shorting with each other during operation.

Figure 3A:
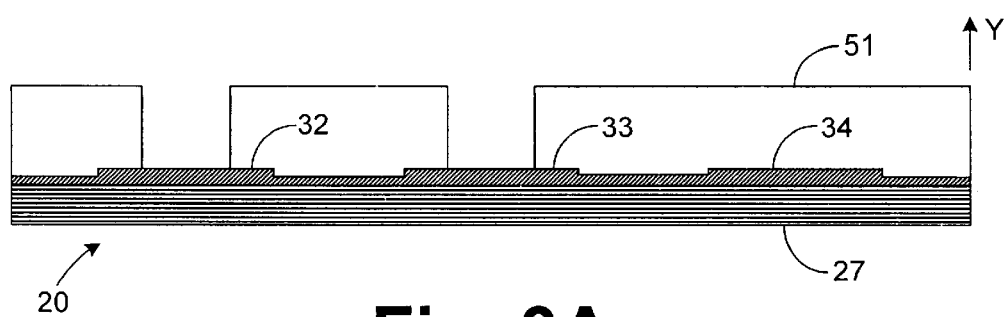
FIG. 3A is a cross sectional view of the microfabricated device of FIG. 2B after a photoresist layer has been formed on the device of FIG. 2B.
Figure 3B:
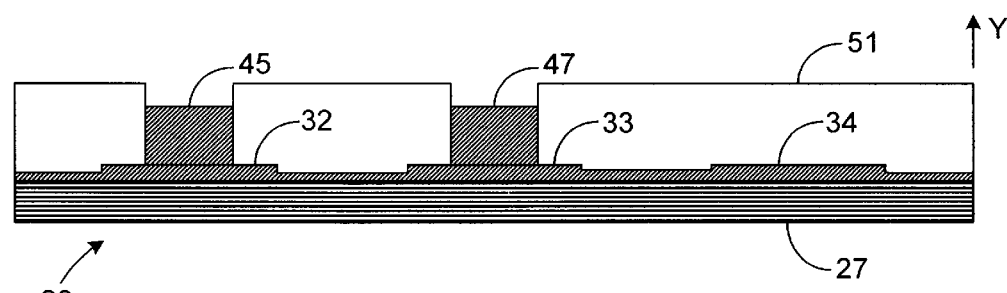
FIG. 3B is a cross sectional view of the microfabricated device of FIG. 3A after conductive posts have been formed.
Figure 3C:
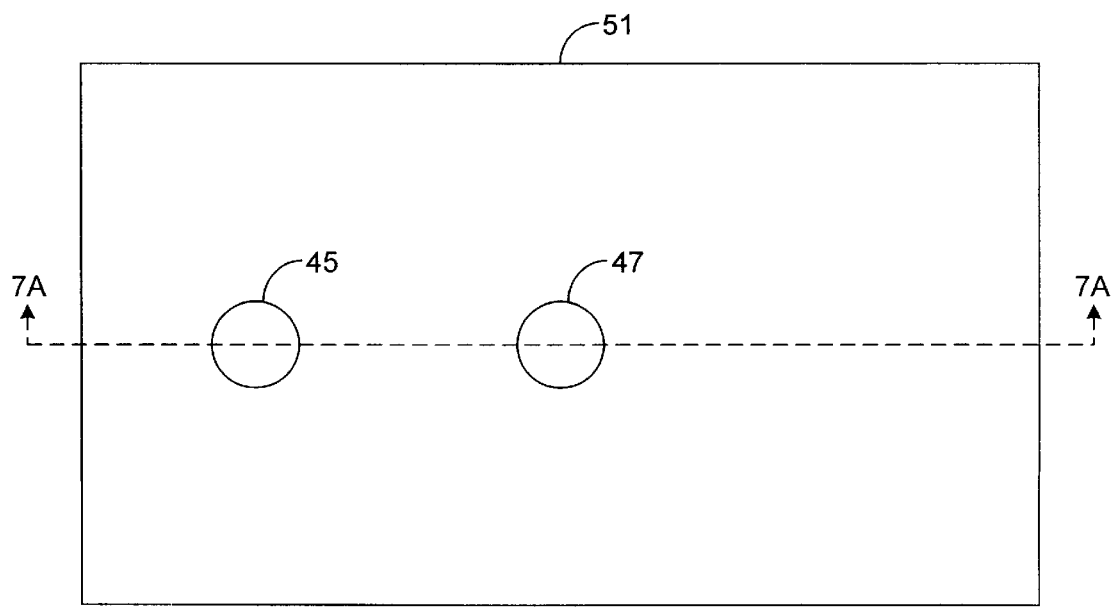
FIG. 3C is a top view of the microfabricated device of FIG. 3B.

Once the connections 32–34 are formed, conductive posts 45 and 47 (FIG. 3B) are formed at block 48 (FIG. 1) on a portion of each connection 32 and 33 that is to be electrically connected to conductive connections on other layers of the device 20, as will be described in further detail hereinafter. As used herein, a conductive post 45 or 47 is conductive material of any shape or size that is connected to a portion of any of the conductive connections 32–34 such that the post 45 or 47 extends higher (in the y-direction) than other portions of the connections 32–34, as shown by FIGS. 3B and 3C.

Figure 4:
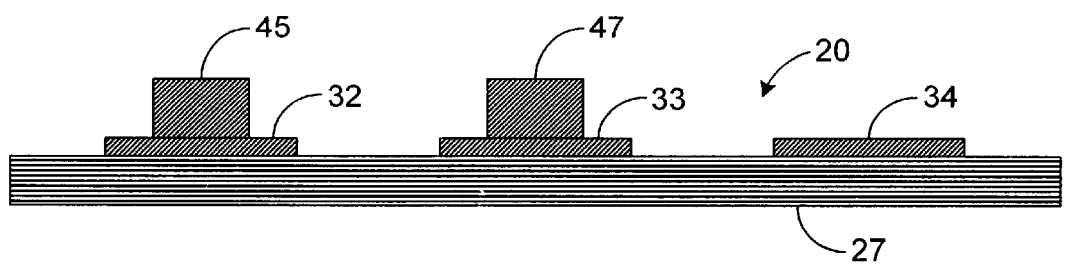
FIG. 4 is a cross sectional view of the microfabricated device of FIG. 3B after the photoresist layer and exposed portions of the seeding layer have been removed from the device of FIG. 3B.

Any suitable microfabrication technique may be employed to form the posts 45 and 47. In the preferred embodiment electro pattern plating is utilized where a photoresist layer 51 is applied to the outer surface of seed layer 25 and connections 32–34. The photoresist layer 51 is patterned to expose portions of connections 32 and 33, as shown by FIG. 3A. Then, conductive material is plated over the exposed portions of connections 32 and 33 to form posts 45 and 47, as shown by FIGS. 3B and 3C. It should be noted that other shapes and sizes of the posts 45 and 47 are possible. Once posts 45 and 47 are formed, the photoresist layer 51 is removed via any suitable microfabrication technique known in the art. Furthermore, in embodiments including a seed layer 25, the seed layer 25 is preferably removed along with the removal of the photoresist layer 51, as depicted by FIG. 4.

Figure 5:
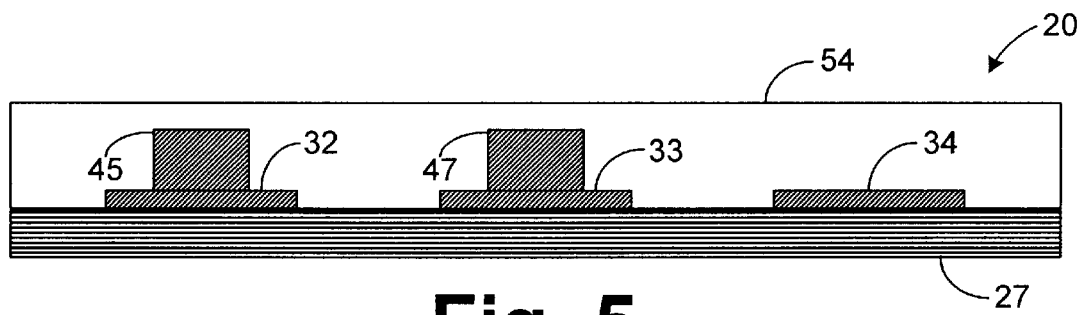
FIG. 5 is a cross sectional view of the microfabricated device of FIG. 4 after an insulating layer has been formed on the device of FIG. 4 in accordance with the first embodiment of the present invention.

Next, an insulating layer 54 is formed on the substrate 27, connections 32–34, and posts 45 and 47, as shown by FIG. 5 and block 55 of FIG. 1. Although other materials may be used for the insulating layer 54, the insulating layer 54 is comprised of a dielectric polymer in the preferred embodiment. Although other microfabrication techniques, such as, but not limited to, liquid coating, may be employed to form the insulating layer 54, the insulating layer 54 is formed by dry film lamination in the preferred embodiment. Dry film lamination is preferable because good surface planarization of the insulating layer 54 can be achieved without performing additional planarization steps or processes.

When other processes, such as liquid coating for example, are used to form insulating layer 54, a press step is preferably performed to planarize the surface of the insulating layer 54. In this regard, a press is used to apply pressure to the surface of the insulating layer 54. The pressure applied to the surface of the insulating layer 54 planarizes the insulating layer 54. The surface of the press should be chosen such that easy separation of the press from the surface of the insulating layer 54 occurs. In the preferred embodiment, the surface of the press is comprised of a smooth layer or sheet of polytetrafloruoethylene (or other low surface tension materials), which is readily separable from the polymer material of the insulating layer 54.

Figure 6A:
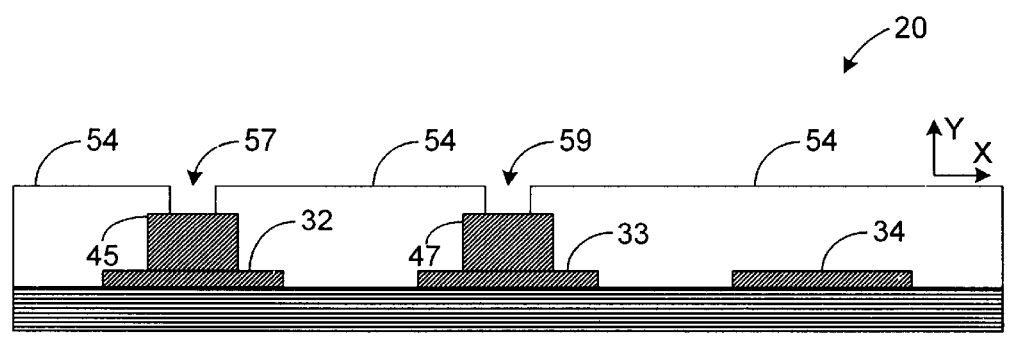
FIG. 6A is a cross sectional view of the microfabricated device of FIG. 5 after holes have been formed in the insulating layer of FIG. 5.
Figure 6B:
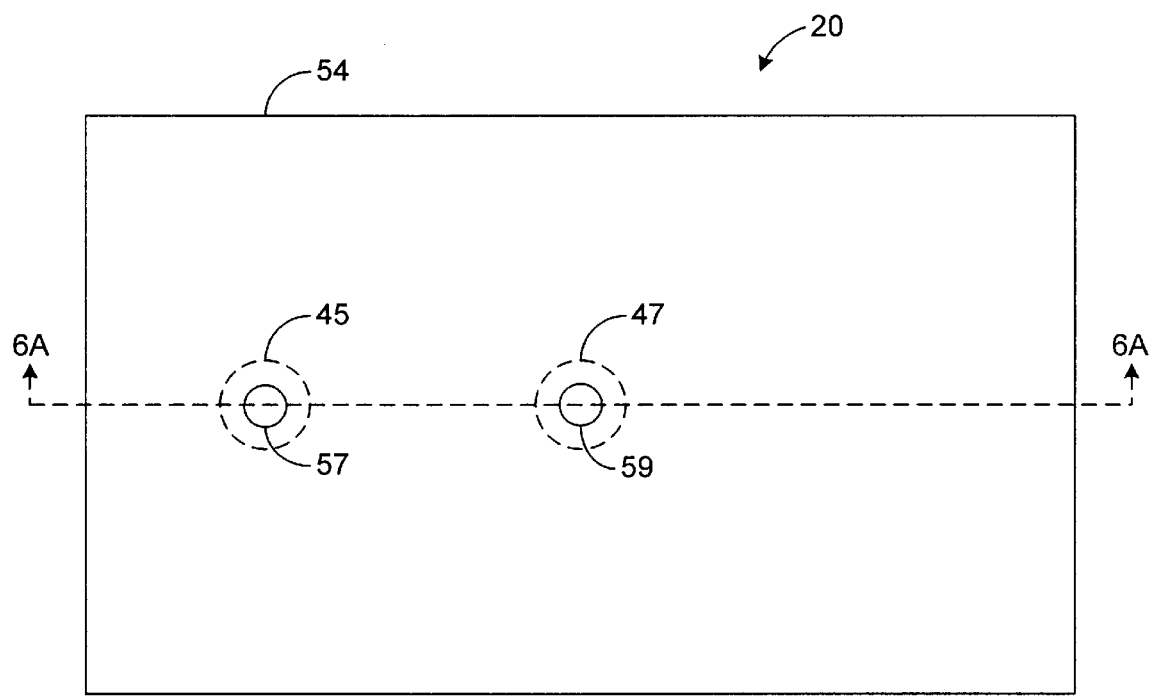
FIG. 6B is a top view of the microfabricated device of FIG. 6A.

Next, holes 57 and 59 are formed in the insulating layer 54 to expose the posts 45 and 47, as depicted by FIGS. 6A and 6B and by block 61 of FIG. 1. The holes 57 and 59 may be formed via any suitable microfabrication process such as, but not limited to, photosensitive polymer, laser ablation, and plasma etching. To maintain surface planarity of the insulating layer 54, the thickness (i.e., length in the y-direction) of the holes 57 and 59 (FIG. 6A) is preferably small enough to maintain surface planarity without performing additional planarization steps.

In this regard, the formation of the holes 57 and 59 should not significantly affect the surface planarity of the insulating layer 54 as long as the thickness of the holes 57 and 59 (i.e., the thickness of the portions of layer 54 that are removed to form the holes 57 and 59) is less than approximately one-third of the total thickness of the insulating layer 54 (i.e., the length of the layer 54 in the y-direction from the substrate 27 to the outer surface of layer 54 in FIG. 5). However, for best results, it is desirable that the thickness of the holes 57 and 59 to be less than approximately one-fourth of the total thickness of the insulating layer 54. In general, the planarity of the layer 54 is better maintained if the thickness of the holes 57 and 59 is smaller. Therefore, it is desirable to minimize the thickness of the holes 57 and 59 as much as possible by minimizing the thickness of the portions of layer 54 that are removed in forming the holes 57 and 59.

Consequently, in the preferred embodiment where dry film lamination is used to form insulating layer 54, the thickness of the layer 54 is selected such that the distance from the surface of the insulating layer 54 to the posts 45 and 47 is at least less than approximately one-third of the total thickness of the insulating layer 54. In other embodiments where, for example, liquid coating is used to form insulating layer 54, the amount of insulating material applied to the device of FIG. 5 should be selected such that the distance from the surface of the insulating layer 54 to the posts 45 and 47 is at least less than approximately one-third of the total thickness of the insulating layer 54, after the insulating material has been pressed.

Figure 7A:
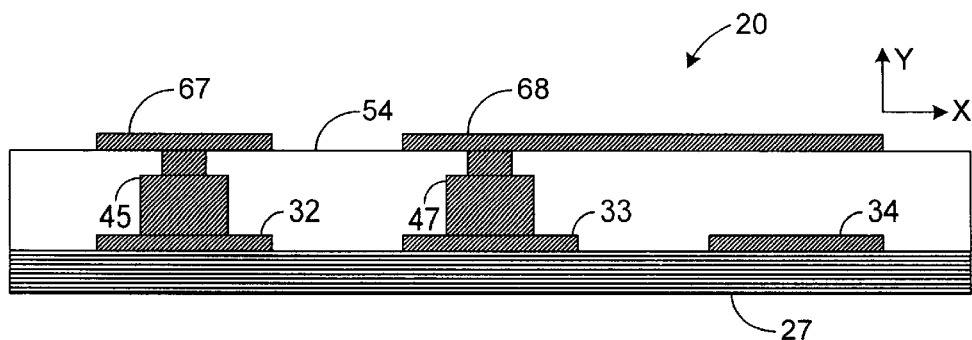
FIG. 7A is a cross sectional view of the microfabricated device of FIG. 6A after conductive connections have been formed on the device of FIG. 6A.
Figure 7B:
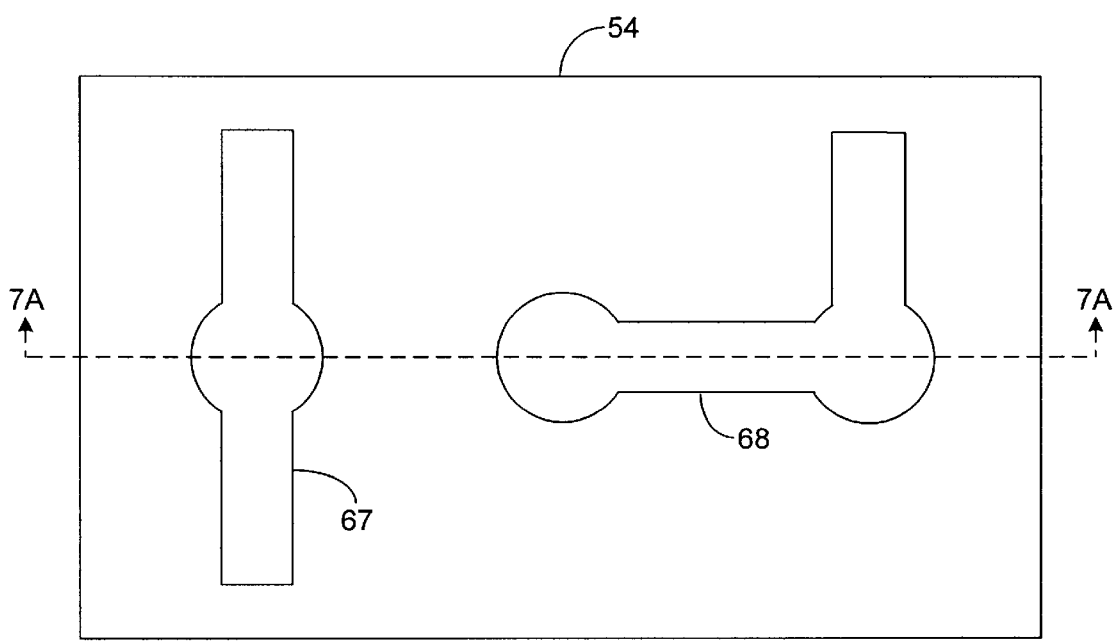
FIG. 7B is a top view of the microfabricated device of FIG. 7A.

After the formation of holes 57 and 59, conductive connections 67 and 68 are formed on insulating layer 54 via any suitable microfabrication process, as shown by FIG. 7A. During or before the formation of connections 67 and 68, the holes 57 and 59 are filled with conductive material so that connections 67 and 68 are electrically coupled to posts 45 and 47, respectively. Connections 67 and 68 are similar to connections 32–34. In this regard, the connections 67 and 68 may extend over various portions of the layer 54, as shown by FIG. 7B. It should be noted that only two connections 67 and 68 are shown in FIGS. 7B and 7C for simplicity. However, the number of connections 67 and 68 and the configuration of connections 67 and 68 may vary without departing from the principles of the present invention.

Figure 8:
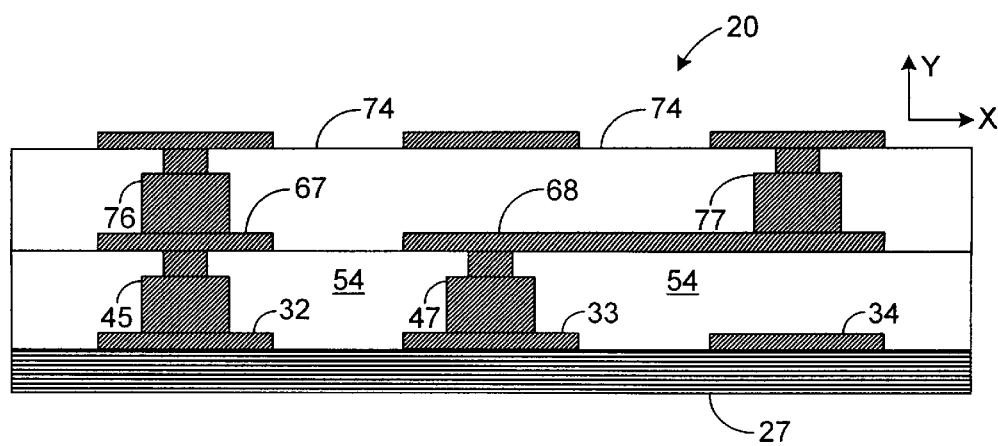
FIG. 8 is a cross sectional view of the microfabricated device of FIG. 7A after another insulating layer has been formed on the device of FIG. 7A and after conductive connections formed on the other insulating layer have been electrically coupled with underlying conductive connections.

Multiple insulating layers 54 and 74 may be formed according to the aforementioned techniques to further increase the wiring capacity of the device 20, as shown by FIG. 8. The posts 45 and 47 may be respectively stacked or staggered with posts 76 and 77. In this regard, "stacked" and "staggered" are terms well known in the art. "Stacked" refers to two interconnected posts respectively located in two consecutive layers 54 and 74 where a portion of one post directly underlies a portion of the other post. "Staggered" refers to two interconnected posts respectively located in two consecutive layers 54 and 74 where no portion of one post directly underlies a portion of the other post. As an example, posts 45 and 76 are stacked, and posts 47 and 77 are staggered.

It should be noted that the widths (i.e., length in the x-direction) of the connections 32–34, connections 67 and 68, and/or posts 45 and 47 may be varied without departing from the principles of the present invention. In addition, except as otherwise discussed herein, the thicknesses of each or any of the components of the device 20 may be varied, although it is desirable for the thickness of the insulating layer 54 to be large enough to insulate connections 32–34 from connections 67 and 68.

Figure 9:
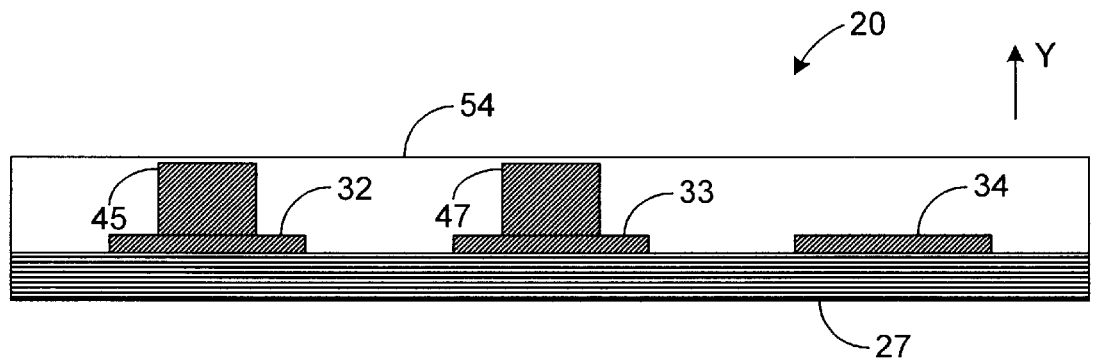
FIG. 9 is a cross sectional view of the microfabricated device of FIG. 4 after an insulating layer has been formed on the device of FIG. 4 in accordance with a second embodiment of the present invention.
Figure 10:
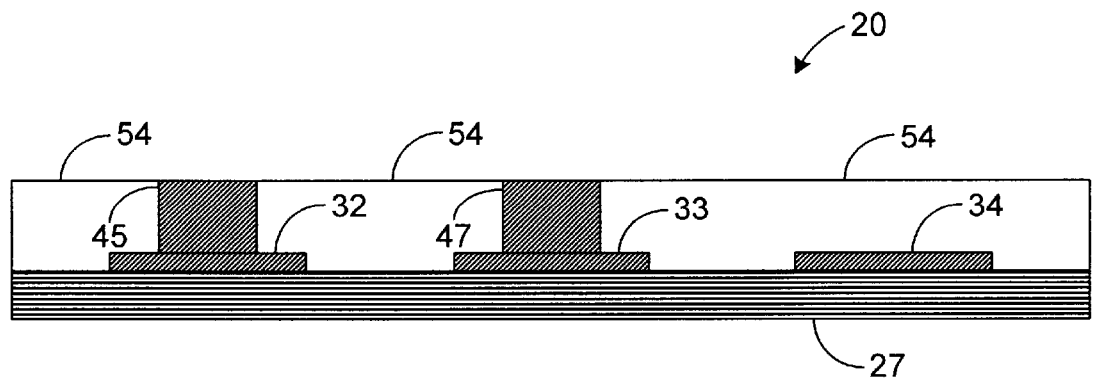
FIG. 10 is a cross sectional view of the microfabricated device of FIG. 9 after conductive posts have been exposed by a roughening process.

In a second embodiment of the present invention, the necessity of forming holes 57 and 59 is entirely eliminated. In this regard, the thicknesses of the insulating layer 54 and posts 45 and 47 are selected such that only a small amount of insulating material covers the posts 45 and 47, as shown by FIG. 9. The thickness of the insulating material covering the posts 45 and 47 (i.e., the distance from the surface of the posts 45 and 47 to the surface of the insulating layer 54 in the y-direction) should be small enough such that conventional surface roughening processes expose the posts 45 and 47, as depicted by FIG. 10.

Conventional surface roughening processes are processes that reduce the smoothness of a polymer surface and alter the surface's chemistry, usually for the purpose of promoting the adhesive properties of the surface. Examples of some conventional surface roughening processes include, but are not limited to, wet chemical swelling/etching, dry plasma reactive ion etching (RIE), and laser ablation. Conventional surface roughening processes typically remove a thin layer of the surface being roughened. The thickness of the insulating layer 54 covering the posts 45 and 47 (i.e., the distance between the surface of the insulating layer 54 and the surfaces of the posts 45 and 47 in the y-direction) in FIG. 9 should correspond to the thin layer removed by the surface roughening process. Typically, about 1 micron of the surface being roughened is removed by conventional roughening processes. Therefore, it is preferable that the thickness of the insulating layer 54 covering the posts 45 and 47 in FIG. 9 be less than approximately 1 micron.

Figure 11:
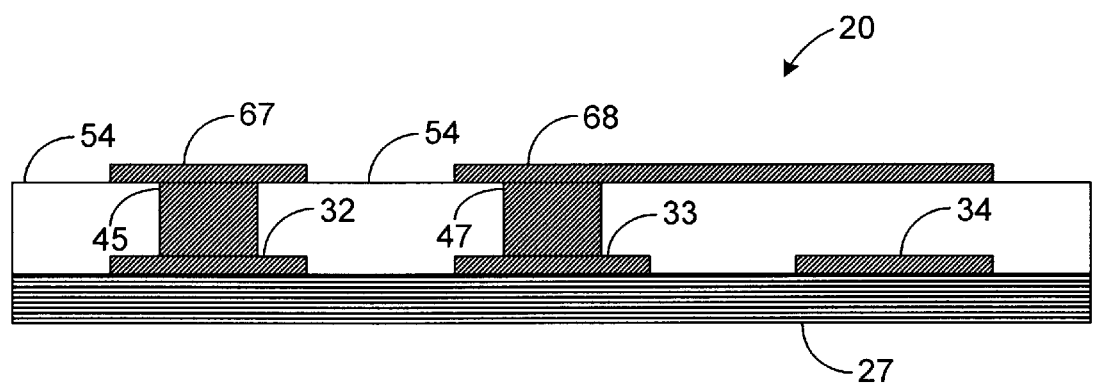
FIG. 11 is a cross sectional view of the microfabricated device of FIG. 10 after conductive connections have been formed on the insulating layer of FIG. 10.

By keeping the thickness of the insulating layer 54 covering the posts 45 and 47 in FIG. 9 equal to or less than the thickness of the material removed by the surface roughening process, the posts 45 and 47 in FIG. 9 are exposed without the formation of holes 57 and 59 (FIG. 6A). After exposing the posts 45 and 47, the connections 67 and 68 are formed on and electrically connected to the posts 45 and 47, as shown by FIG. 11. Therefore, other than the differences described hereinabove between the first embodiment and the second embodiment in exposing the posts 45 and 47, the methodology of the second embodiment is the same as that of the preferred embodiment.

In concluding the detailed description, it should be noted that it will be obvious to those skilled in the art that many variations and modifications may be made to the preferred embodiment without substantially departing from the principles of the present invention. All such variations and modifications are intended to be included herein within the scope of the present invention, as set forth in the following claims.

Now, therefore, the following is claimed:

1. A method for manufacturing a microfabricated device, comprising the steps of:
   forming a first conductive connection on a first insulating layer;
   forming a conductive post on said first conductive connection;
   forming a second insulating layer via dry film lamination on said first conductive connection, said first insulating layer, and said conductive post;
   exposing said conductive post by removing a portion of said second insulating layer; and
   forming a second conductive connection on said second insulating layer such that said second conductive connection is electrically coupled to said first conductive connection via said conductive post,
   wherein said forming a conductive post step includes the steps of:
      forming a sacrificial mask layer on said microfabricated device, said sacrificial mask layer having a hole exposing a portion of said first conductive connection;
      applying conductive material to said exposed portion of said first conductive connection subsequent to said forming a sacrificial mask layer step; and
      removing said sacrificial mask layer subsequent to said applying step.

2. The method of claim 1, wherein said forming a conductive post step is performed without performing a polishing step.

3. A method for manufacturing a microfabricated device, comprising the steps of:
   forming a first conductive connection on a first insulating layer;
   forming a conductive post on said first conductive connection;
   forming a second insulating layer on said first conductive connection, said first insulating layer, and said conductive post;
   exposing said conductive post by removing a portion of said second insulating layer; and
   forming a second conductive connection on said second insulating layer such that said second conductive connection is electrically coupled to said first conductive connection via said conductive post,
   wherein said exposing step includes the step of roughening a surface of said second insulating layer.

4. The method of claim 3, wherein said forming a second insulating layer step is performed such that said surface of said second insulating layer is less than approximately one micron from said conductive post before said roughening step.

5. The method of claim 3, further comprising the step of planarizing said second insulating layer prior to said roughening step.

6. The method of claim 3, further comprising the step of performing said forming a second insulating layer step via dry film lamination.

7. A method for manufacturing a microfabricated device, comprising the steps of:
   forming a first conductive connection on a first insulating layer;
   forming a conductive post on said first conductive connection;
   forming a second insulating layer on said first conductive connection, said first insulating layer, and said conductive post;
   exposing said conductive post by removing a portion of said second insulating layer, said exposing step including the step of forming a hole in a surface of said second insulating layer;
   forming a second conductive connection on said second insulating layer such that said second conductive connection is electrically coupled to said first conductive connection via said conductive post; and
   inserting conductive material into said hole.

8. The method of claim 7, wherein said forming a second insulating layer step is performed such that a distance between said surface of said second insulating layer and said conductive post is less than approximately one-third of said thickness.

9. The method of claim 7, wherein said forming a second insulating layer step is performed such that a distance between said surface of said second insulating layer and said conductive post is less than approximately one-fourth of said thickness.

10. The method of claim 7, further comprising the step of performing said forming a second insulating layer step via dry film lamination.

11. A method for manufacturing a microfabricated device, comprising the steps of:
   forming a first conductive connection on a first insulating layer;
   forming a conductive post on said first conductive connection;
   forming a second insulating layer on said first conductive connection, said first insulating layer, and said conductive post;
   applying a press to a surface of said second insulating layer;
   removing said press from said surface;
   exposing said conductive post by removing a portion of said second insulating layer; and
   forming a second conductive connection on said second insulating layer such that said second conductive connection is electrically coupled to said first conductive connection via said conductive post.

12. The method of claim 11, wherein a surface of said press is comprised of polytetrafloruoethylene (PTFE).

13. The method of claim 11, wherein said exposing step includes the step of forming a hole in said surface of said second insulating layer and wherein said method further includes the step of inserting conductive material into said hole.

14. The method of claim 13, wherein said second insulating layer is formed via dry film lamination.

15. The method of claim 13, wherein said forming a second insulating layer step is performed such that a distance between said surface of said second insulating layer and said conductive post is less than approximately one-third of a distance between said first insulating layer and said second insulating layer subsequent to said applying step.

16. The method of claim 13, wherein said forming a second insulating layer step is performed such that a distance between said surface of said second insulating layer and said conductive post is less than approximately one-fourth of a distance between said first insulating layer and said second insulating layer subsequent to said applying step.

17. The method of claim 11, wherein said exposing step includes the step of roughening a surface of said second insulating layer.

18. The method of claim 17, wherein said applying step planarizes said surface of said second insulating layer such that said surface of said second insulating is less than approximately one micron from said conductive post before said roughening step.

19. A method for manufacturing a microfabricated device, comprising the steps of:
   forming a first conductive connection on a first insulating layer;
   forming a conductive post on said first conductive connection;
   forming a second insulating layer on said first conductive connection, said first insulating layer, and said conductive post;
   exposing said conductive post by roughening a surface of said second insulating layer; and
   forming a second conductive connection on said second insulating layer such that said second conductive connection is electrically coupled to said first conductive connection via said conductive post.

20. The method of claim 19, wherein said forming a second insulating layer step is performed such that a surface of said second insulating layer is less than approximately one micron from said conductive post before said roughening step.

21. The method of claim 19, further including the step of planarizing a surface of said second insulating layer by applying pressure to said surface.

22. The method of claim 21, wherein said forming a second insulating layer step is performed such that said surface of said second insulating layer is less than approximately one micron from said conductive post subsequent to said planarizing step.

* * * * *

UNITED STATES PATENT AND TRADEMARK OFFICE
CERTIFICATE OF CORRECTION

PATENT NO.    : 6,261,941 B1
DATED         : July 17, 2001
INVENTOR(S)   : Li et al.

It is certified that error appears in the above-identified patent and that said Letters Patent is hereby corrected as shown below:

Title page,
References Cited, insert
-- 5,287,619    02/1994    Smith et al..................... 29/852
5,485,038      01/1996    Licari et al.................. 257/758 --

Column 5,
Line 40, after "59" delete "to".

Column 8,
Lines 28 and 33, "said thickness" should be deleted and replaced with -- the thickness of said second insulating layer --.

Signed and Sealed this

Thirtieth Day of April, 2002

Attest:

JAMES E. ROGAN
*Attesting Officer*   *Director of the United States Patent and Trademark Office*